United States Patent
Rantala et al.

(10) Patent No.: US 7,504,470 B2
(45) Date of Patent: *Mar. 17, 2009

(54) POLYORGANOSILOXANE DIELECTRIC MATERIALS

(75) Inventors: Juha T. Rantala, Espoo (FI); Jyri Paulasaari, Turku (FI); Janne Kylmä, Helsinki (FI); Turo T. Törmänen, Espoo (FI); Jarkko Pietikäinen, Helsinki (FI); Nigel Hacker, Livermore, CA (US); Admir Hadzic, Helsinki (FI)

(73) Assignee: Silecs Oy, Espoo (FI)

( * ) Notice: Subject to any disclaimer, the term of this patent is extended or adjusted under 35 U.S.C. 154(b) by 482 days.

This patent is subject to a terminal disclaimer.

(21) Appl. No.: 11/215,303

(22) Filed: Aug. 31, 2005

(65) Prior Publication Data

US 2006/0058487 A1    Mar. 16, 2006

Related U.S. Application Data

(60) Provisional application No. 60/605,553, filed on Aug. 31, 2004, provisional application No. 60/644,304, filed on Jan. 18, 2005.

(51) Int. Cl.
*C08G 77/18* (2006.01)

(52) U.S. Cl. .......................... 528/35; 556/435; 428/447

(58) Field of Classification Search ................. 528/35; 556/435; 428/447
See application file for complete search history.

(56) References Cited

U.S. PATENT DOCUMENTS

| | | | | |
|---|---|---|---|---|
| 5,204,141 | A * | 4/1993 | Roberts et al. | 427/255.37 |
| 5,233,069 | A * | 8/1993 | Jung et al. | 556/435 |
| 5,235,083 | A * | 8/1993 | Jung et al. | 556/435 |
| 6,410,150 | B1 | 6/2002 | Kurosawa et al. | 428/447 |
| 6,410,151 | B1 * | 6/2002 | Kurosawa et al. | 428/447 |
| 6,465,368 | B2 | 10/2002 | Inoue et al. | 438/780 |
| 6,495,264 | B2 * | 12/2002 | Hayashi et al. | 428/447 |
| 6,503,633 | B2 * | 1/2003 | Nishikawa et al. | 428/447 |
| 2001/0053840 | A1 | 12/2001 | Ko et al. | 528/36 |
| 2002/0189495 | A1 * | 12/2002 | Hayashi et al. | 106/287.13 |
| 2003/0077461 | A1 * | 4/2003 | Nishikawa et al. | 428/447 |
| 2003/0091838 | A1 * | 5/2003 | Hayashi et al. | 428/447 |
| 2003/0216058 | A1 | 11/2003 | Ko et al. | 438/781 |
| 2004/0242013 | A1 | 12/2004 | Lyu et al. | 438/720 |
| 2005/0194619 | A1 | 9/2005 | Edelstein et al. | 257/232 |

FOREIGN PATENT DOCUMENTS

| | | |
|---|---|---|
| EP | 1 037 275 A1 | 9/2000 |
| EP | 1 457 583 A2 | 9/2004 |
| WO | 03/063205 A2 | 7/2003 |

OTHER PUBLICATIONS

Stn International, File Caplus, Takeuchi, Shigeki et al. JP, A2, 05070772, 19930323.
Database WPO, Week 200064, Derwent publ. AN2000-658385 & JP 2000223487 (Hitachi Chem Co Ltd.).

* cited by examiner

*Primary Examiner*—Margaret G Moore
(74) *Attorney, Agent, or Firm*—Kubovcik & Kubovcik

(57) ABSTRACT

A thin film comprising a composition obtained by polymerizing a monomer having the formula I:

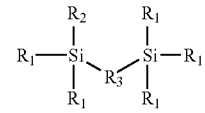

wherein:
 $R_1$ is a hydrolysable group,
 $R_2$ is a polarizability reducing organic group, and
 $R_3$ is a bridging hydrocarbon group,
to form a siloxane material. The invention also concerns methods for producing the thin films. The thin film can be used a low k dielectric in integrated circuit devices. The novel dielectric materials have excellent properties of planarization resulting in good local and global planarity on top a semiconductor substrate topography, which reduces or eliminates the need for chemical mechanical planarization after dielectric and oxide liner deposition.

17 Claims, 2 Drawing Sheets

POLYORGANOSILOXANE DIELECTRIC MATERIALS

This application claims priority of U.S. Provisional Applications for Patent Ser. Nos. 60/605,553 filed Aug. 31, 2004, and 60/644,304 filed Jan. 18, 2005, which are incorporated herein by reference.

BACKGROUND OF THE INVENTION

1. Field of the Invention

The present invention relates to thin films suitable as dielectrics in IC's and for other similar applications. In particular, the invention concerns thin films comprising compositions obtainable by polymerization of silicon containing monomers, which yield an at least partially cross-linked siloxane structure. The invention also concerns a method for producing such films by preparing siloxane compositions by polymerization of the monomers, by applying the polymerized compositions on a substrate in the form of a layer and by curing the layer to form a film. Further, the invention concerns integrated circuit devices and methods of manufacturing them.

2. Description of Related Art

Built on semiconductor substrates, integrated circuits comprise millions of transistors and other devices, which communicate electrically with one another and with outside packaging materials through multiple levels of vertical and horizontal wiring embedded in a dielectric material. Within the metallization structure, "vias" make up the vertical wiring, whereas "interconnects" form the horizontal wiring. Fabricating the metallization can involve the successive depositing and patterning of multiple layers of dielectric and metal to achieve electrical connection among transistors and to outside packaging material. The patterning for a given layer is often performed by a multi-step process comprising layer deposition, photoresist spin, photoresist exposure, photoresist develop, layer etch, and photoresist removal on a substrate. Alternatively, the metal may sometimes be patterned by first etching patterns into a layer of a dielectric material, filling the pattern with metal, then subsequently chemically/mechanically polishing the metal so that the metal remains embedded only in the openings of the dielectric. As an interconnect material, aluminum has been utilized for many years due to its high conductivity, good adhesion to $SiO_2$, known processing methods (sputtering and etching) and low cost. Aluminum alloys have also been developed over the years to improve the melting point, diffusion, electromigration and other qualities as compared to pure aluminum. Spanning successive layers of aluminum, tungsten has traditionally served as the conductive via plug material.

In IC's, silicon dioxide, having a dielectric constant of around 4.0, has been the dielectric of choice, used in conjunction with aluminum-based and tungsten-based interconnects and via for many years.

The drive to faster microprocessors and more powerful electronic devices in recent years has resulted in very high circuit densities and faster operating speeds which—in turn—have required that higher conductivity metals and significantly lower-k dielectrics compared to silicon dioxide (preferably below 3.0) be used. In the past few years, VLSI (and ULSI) processes have been moving to copper damascene processes, where copper (or a copper alloy) is used for the higher conductance in the conductor lines and a spin-on or CVD process is used for producing low-k dielectrics which can be employed for the insulating material surrounding the conductor lines. To circumvent problems with etching, copper along with a barrier metal is blanket deposited over recessed dielectric structures consisting of interconnect and via openings and subsequently polished in a processing method known as the "dual damascene." The bottom of the via opening is usually the top of an interconnect from the previous metal layer or, in some instances, the contacting layer to the substrate.

Summarizing: aside from possessing a low dielectric constant, the ideal dielectric should have the following properties:

1. High modulus and hardness in order to bind the maze of metal interconnects and vias together in particular in the final chip packaging step as well as abet chemical mechanical polishing processing steps.
2. Low thermal expansion, typically less than or equal to that of metal interconnects.
3. Excellent thermal stability, generally in excess of 400° C., but more often even better than 500° C.
4. No cracking even as thick films structures, excellent fill and planarization properties.
5. Excellent adhesion to dielectric, semiconductor, diffusion barrier and metal materials.
6. Sufficient thermal conductivity to dissipate joule heating from interconnects and vias.
7. Material density that precludes absorption of solvents, moisture, or reactive gasses.
8. Allows desired etch profiles at very small dimensions.
9. Low current leakage, high breakdown voltages, and low loss-tangents.
10. Stable interfaces between the dielectric and contacting materials.

By necessity, low-k materials are usually engineered on the basis of compromises.

Organic polymers can be divided into two different groups with respect to the behavior of their dielectric constant. Non-polar polymers contain molecules with almost purely covalent bonds. Since they mainly consist of non-polar C-C bonds, the dielectric constant can be estimated using only density and chemical composition. Polar polymers do not have low loss, but rather contain atoms of different electronegativity, which give rise to an asymmetric charge distribution. Thus polar polymers have higher dielectric loss and a dielectric constant, which depends on the frequency and temperature at which they are evaluated. Several organic polymers have been developed for dielectric purposes. However, applicability of these films is limited because of their low thermal stability, softness, and incompatibility with traditional technological processes developed for $SiO_2$ based dielectrics.

Therefore most of the current developments are focusing on SSQ (silsesquioxane or siloxane) or silica based dielectric materials. For SSQ based materials, silsesquioxane (siloxane) is the elementary unit. Silsesquioxanes, or T-resins, are organic-inorganic hybrid polymers with the empirical formula $(R-SiO_{3/2})_n$. The most common representative of these materials comprise a ladder-type structure, and a cage structure containing eight silicon atoms placed at the vertices of a cube ($T_8$ cube) on silicon can include hydrogen, alkyl, alkenyl, alkoxy, and aryl. Many silsesquioxanes have reasonably good solubility in common organic solvents due to their organic substitution on Si. The organic substitutes provide low density and low dielectric constant matrix material. The lower dielectric constant of the matrix material is also attributed to a low polarizability of the Si—R bond in comparison with the Si—O bond in $SiO_2$. The silsesquioxane based materials for microelectronic application are mainly hydrogen-silsesquioxane, HSQ, and methyl-silsesquioxane, $(CH_3-SiO_{3/2})_n$ (MSQ). MSQ materials have a lower dielectric constant as compared to HSQ because of the larger size of the CH$_3$ group ~2.8 and 3.0-3.2, respectively and lower polarizability of the Si—CH$_3$ bond as compared to Si—H.

The silica-based materials have the tetrahedral basic structure of SiO$_2$. Silica has a molecular structure in which each Si atom is bonded to four oxygen atoms. Each silicon atom is at the center of a regular tetrahedron of oxygen atoms, i.e., it forms bridging crosslinks. All pure of silica have dense structures and high chemical and excellent thermal stability. For example, amorphous silica films, used in microelectronics, have a density of 2.1 to 2.2 g/cm$^3$. However, their dielectric constant is also high ranging from 4.0 to 4.2 due to high frequency dispersion of the dielectric constant which is related to the high polarizability of the Si—O bonds. Therefore, it is necessary to replace one or more Si—O—Si bridging groups with C-containing organic groups, such as CH$_3$ groups, which lowers the k-value. However, these organic units reduce the degrees of bridging crosslinks as well increases the free volume between the molecules due to steric hindrance. Therefore, their mechanic strength (Young's modulus <6 GPa) and chemical resistance is reduced compared to tetrahedral silicon dioxide. Also, these methyl-based silicate and SSQ (i.e., MSQ) polymers have relatively low cracking threshold, typically on the order of 1 um or less.

Quite recently there have been some efforts to develop enhanced MSQ polymers by co-polymerizing them with disilanes, i.e., bistrimethoxysilane, that contain bridging alkyl groups between silanes and thus crosslinking density has been increased. However, these materials still contain significant amount of methyl-based silanes, i.e. methyl-trimethoxysilane, as comonomers and due to methyl co-polymer nature only moderate Young's modulus and hardness properties has been obtained, with dielectric constant of around 2.93.

SUMMARY OF THE INVENTION

It is an object of the present invention to eliminate the problems of the known technical solutions and to provide novel thin films, which have excellent mechanical and thermal properties.

It is another object of the invention to provide dielectric layers on silicon wafers.

It is a third object of the invention to provide methods of producing poly(organo siloxane) compositions which are suitable for the preparation of thin films having excellent dielectric properties.

It is a still a fourth object of the invention to provide a method of patterning dielectric films in semiconductor devices.

These and other objects, together with the advantages thereof over the known dielectric thin films and methods for the preparation thereof, which shall become apparent from specification which follows, are accomplished by the invention as hereinafter described and claimed.

In order to achieve these objectives in the present invention, we introduce a multisilane molecule based polyorgano silsesquioxane material for an interlayer insulating film for a semiconductor device. The polymer is based on one precursor molecule and no co-monomers are applied.

Generally, the monomer comprises two metal atoms which are interconnected by a bridging hydrocarbyl radical and which exhibit hydrolysable substitutents on both of the metal atoms along with at least one organic group which is capable of reducing the polarizability of the polymer formed from the monomer. In particular, the metal atoms are silicon atoms, and the bridging radical is a linear or branched hydrocarbyl group which links the two silicon atoms together. Furthermore, one of the silicon atoms contains three hydrolysable groups and the other silicon atom contains two hydrolysable groups and a polarizability reducing organic group, such as an alkyl, an alkenyl or an aryl organic group. The latter group may be fully or partially fluorinated.

The general formula I of the precursor used in the present invention is the following:

wherein:
  R$_1$ is a hydrolysable group, such as a halide, an alkoxy or an acyloxy group,
  R$_2$ is a polarizability reducing organic group, such as an alkyl, alkenyl or aryl group, and
  R$_3$ is a bridging group, in particular a (bivalent) linear or branched hydrocarbyl group.

The polymer of the present innovation is formed by hydrolysing the hydrolysable groups of the multisilane monomer and then further polymerising it by a condensation polymerisation process.

The new material can be used as a low k dielectric film in an object comprising e.g. a (silicon) wafer.

The present invention also provides a method of forming a thin film having a dielectric constant of 3.0 or less, comprising homopolymerizing a monomer having the formula I, to form a siloxane material, depositing the siloxane material in the form of a thin layer; and curing the thin layer to form a film.

Finally, the invention provides a number of alternative embodiments for making integrated circuit devices of a kind, which comprises a plurality of transistors on a semiconductor substrate and having multilayer interconnects. The multilayer interconnects are formed by depositing a layer of metal, patterning the metal layer, depositing a first dielectric material having a first modulus and a first k value, depositing a second dielectric material having a second modulus higher than the first modulus of the first material and with a k value lower than the first k value of the first material, and—without performing chemical mechanical planarization—patterning the first and second dielectric materials and depositing a via filling metal material into the patterned areas. The first dielectric material preferably comprises a material as described herein.

More specifically, the new materials according to the present invention are characterized by a thin film obtained by polymerizing a monomer as described herein.

The object of the invention is characterized by a low k dielectric film having a dielectric constant of less than 3.0, preferably 2.9 or lower. The film is used to make integrated circuit devices.

The methods of making integrated circuit devices are characterized by what is stated in claims 28 and 29, and the integrated circuit devices by what is stated in claim 32.

Considerable advantages are obtained by the present novel materials and by the methods of manufacturing them. Thus, the present invention presents a solution for existing problems related to low-k dielectric polymers, more specifically mechanical properties (modulus and hardness), cracking threshold and thermal properties, especially applicable for aluminum reflow processing temperatures (also known as hot aluminum process). At the same time, the present invention provides excellent chemical resistance and very low chemical adsorption behavior due to high cross-linking bridging group density.

Another important advantages is that the novel low-k dielectric materials have excellent properties of planarization resulting in excellent local and global planarity on top a semiconductor substrate topography, which reduces or even fully eliminates the need for chemical mechanical planarization after dielectric and oxide liner deposition.

Furthermore, the novel materials have excellent gap fill properties.

Next, the invention will be examined more closely by means of the following detailed description and with reference to a number of working examples.

DETAILED DESCRIPTION OF THE INVENTION

The present innovation provides a low dielectric constant siloxane polymer applicable for forming thermally and mechanically stable, high cracking threshold, dense and low pore volume and pore size dielectric film. The polymer results in water and silanol free film with excellent local and global planarization as well as gap fill after subjected to thermal treatment with having excellent electrical properties. A film made out of the invented polymer remains structurally, mechanically and electrically unchanged after final cure even if subjected to temperatures higher than the final cure temperature. All these properties, as they are superior over conventional low dielectric constant polymers, are crucial to overcome existing problems in low dielectric constant film integration to a semiconductor device.

The present innovation provides a homogeneous low dielectric constant polymer comprising only one component multisilane mononer unit with at least one organic bridging group between silicon atoms. In addition, one of the silicon atoms also contains one polarizability reducing group, such as an alkyl, alkylene or aryl organic group. One of the silicon atoms comprises two hydrolysable groups and the other three hydrolysable groups capable of forming a continuous siloxane backbone matrix once hydrolyzed and polymerized, such as halide, alkoxy or acyloxy groups, but most preferably chlorine groups.

The general formula I of the precursor used in the present invention is the following:

wherein:
R$_1$ is a hydrolysable group
R$_2$ is a polarizability reducing organic group, and
R$_3$ is a bridging group, in particular a linear or branched hydrocarbyl residue.

R$_1$ is preferably selected from the group of halides, alkoxy groups and acyloxy groups, R$_2$ is preferably selected from alkyl groups, alkenyl groups and aryl groups, and R$_3$ is preferably selected from linear and branched alkylene groups, alkenylene groups and alkynylene groups.

The cured composition obtained by essentially homopolymerizing monomers of the above formula, with subsequent curing to achieve cross-linking, comprises a cross-linked organosiloxane polymer, i.e. poly(organosiloxane). It can be formed into a thin film.

'Alkenyl' as used herein includes straight-chained and branched alkenyl groups, such as vinyl and allyl groups. The term 'alkynyl' as used herein includes straight-chained and branched alkynyl groups, suitably acetylene. 'Aryl' means a mono-, bi-, or more cyclic aromatic carbocyclic group, substituted or non-substituted; examples of aryl are phenyl and naphthyl. More specifically, the alkyl, alkenyl or alkynyl may be linear or branched.

Alkyl contains preferably 1 to 18, more preferably 1 to 14 and particularly preferred 1 to 12 carbon atoms. The alkyl is preferably branched at the alpha or beta position with one and more, preferably two, C$_1$ to C$_6$ alkyl groups, especially preferred halogenated, in particular partially or fully fluorinated or per-fluorinated alkyl, alkenyl or alkynyl groups. Some examples are non-fluorinated, partially fluorinated and per-fluorinated i-propyl, t-butyl, but-2-yl, 2-methylbut-2-yl, and 1,2-dimethylbut-2-yl. In particular, the alkyl group is a lower alkyl containing 1 to 6 carbon atoms, which optionally bears 1 to 3 substituents selected from methyl and halogen. Methyl, ethyl, n-propyl, i-propyl, n-butyl, i-butyl and t-butyl are particularly preferred.

Alkenyl contains preferably 2 to 18, more preferably 2 to 14 and particularly preferred 2 to 12 carbon atoms. The ethylenic, i.e. two carbon atoms bonded with double bond, group is preferably located at the position 2 or higher, related to the Si or M atom in the molecule. Branched alkenyl is preferably branched at the alpha or beta position with one and more, preferably two, C$_1$ to C$_6$ alkyl, alkenyl or alkynyl groups, particularly preferred fluorinated or per-fluorinated alkyl, alkenyl or alkynyl groups.

Alkynyl contains preferably 3 to 18, more preferably 3 to 14 and particularly preferred 3 to 12 carbon atoms. The ethylinic group, i.e. two carbon atoms bonded with triple bond, group is preferably located at the position 2 or higher, related to the Si or M atom in the molecule. Branched alkynyl is preferably branched at the alpha or beta position with one and more, preferably two, C$_1$ to C$_6$ alkyl, alkenyl or alkynyl groups, particularly preferred per-fluorinated alkyl, alkenyl or alkynyl groups.

The aryl group is preferably phenyl, which optionally bears 1 to 5 substituents selected from halogen, alkyl or alkenyl on the ring, or naphthyl, which optionally bear 1 to 11 substituents selected from halogen alkyl or alkenyl on the ring structure, the substituents being optionally fluorinated (including per-fluorinated or partially fluorinated).

"Hydrolysable group" stands for halogen (chlorine, fluorine, bromine), alkoxy (in particular C$_{1-10}$ alkoxy, such as methoxy, ethoxy, propoxy, or butoxy), acyloxy or any other group that can easily be cleaved off the monomer during polymerization, e.g. condensation polymerization.

The alkoxy groups stand generally for a group having the formula R$_4$O—, wherein R$_4$ stands for an alkyl as defined above. The alkyl residue of the alkoxy groups can be linear or branched. Typically, the alkoxy groups are comprised of lower alkoxy groups having 1 to 6 carbon atoms, such as methoxy, ethoxy and t-butoxy groups.

The acyloxy groups have the general formula $R_5O_2$—, wherein $R_5$ stands for an alkyl as defined above. In particular, the alkyl residue of the acyloxy group can have the same meanings as the corresponding residue in the alkoxy group.

In the context of the disclosure the organic group substituent halogen may be a F, Cl, Br or I atom and is preferably F or Cl. Generally, term 'halogen' herein means a fluorine, chlorine, bromine or iodine atom.

In the monomer of formula I, the silicon atoms are linked to each other via a linker group. Typically, the linker comprises 1 to 20, preferably about 1 to 10, carbon atoms. Examples of suitable linker groups $R_3$ include alkylene, alkenylene and alkynylene groups. "Alkylene" groups generally have the formula —$(CH_2)_r$— in which r is an integer 1 to 10. One or both of the hydrogens of at least one unit —$CH_2$— can be substituted by any of the substituents mentioned below. The "alkenylene" groups correspond to alkylene residues, which contain at least one double bond in the hydrocarbon backbone. If there are several double bonds, they are preferably conjugated. "Alkynylene" groups, by contrast, contain at least one triple bond in the hydrocarbon backbone corresponding to the alkylene residues.

The bivalent linker residue can be unsubstituted or substituted. The substituents are preferably selected from the group of fluoro, bromo, $C_{1-10}$-alkyl, $C_{1-10}$-alkenyl, $C_{6-18}$-aryl, acryl, epoxy, carboxyl and carbonyl groups. A particularly interesting alternative is comprised of methylene groups substituted with at least one alkyl group, preferably a lower alkyl group or 1 to 4 carbon atoms. As a result of the substitution, a branched linker chain is obtained. The branched linker chain, e.g. —$CH(CH_3)$— can contain in total as many carbon atoms as the corresponding linear, e.g. —$CH_2CH_2$—, even if some of the carbon atoms are located in the side chain, as shown below in connection with the working examples. Such molecules can be considered "isomeric", for the purpose of the present invention.

As examples of a particularly preferred compounds according to formula I, 1-(trichlorosilyl)-2-(methyldichlorosilyl) ethane and 1-(Methyldichlorosilyl)-1-(trichlorosilyl) ethane can be mentioned.

The present invention provides a low dielectric constant siloxane polymer applicable for forming thermally and mechanically stable, high cracking threshold, dense and low pore volume and pore size dielectric film. The polymer results in water and silanol free film with excellent local and global planarization as well as gap fill after subjected to thermal treatment with having excellent electrical properties. A film made out of the invented polymer remains structurally, mechanically and electrically unchanged after final cure even if subjected to temperatures higher than the final cure temperature. All these properties, as they are superior over conventional low dielectric constant polymers, are crucial to overcome existing problems in low dielectric constant film integration to a semiconductor device.

The polymerization synthesis is based on hydrolysis and condensation chemistry synthesis technique. Polymerization can be carried out in melt phase or in liquid medium. The temperature is in the range of about 20 to 200° C., typically about 25 to 160° C., in particular about 80 to 150° C. Generally polymerization is carried out at ambient pressure and the maximum temperature is set by the boiling point of any solvent used. Polymerization can be carried out at refluxing conditions. It is possible to polymerize the instant monomers without catalysts or by using alkaline or, in particular, acidic catalysts.

The present organosiloxane materials have a (weight average) molecular weight of from 500 to 100,000 g/mol. The molecular weight can be in the lower end of this range (e.g., from 500 to 10,000 g/mol, or more preferably 500 to 8,000 g/mol) or the organosiloxane material can have a molecular weight in the upper end of this range (such as from 10,000 to 100,000 g/mol or more preferably from 15,000 to 50,000 g/mol). It may be desirable to mix a polymer organosiloxane material having a lower molecular weight with a organosiloxane material having a higher molecular weight.

We have found that a suitable polymer composition can be obtained by homopolymerizing a monomer of formula I comprising either a linear or a branched linker group.

However, it is also possible to obtain suitable compositions by copolymerizing a first monomer having formula I, wherein $R_3$ stands for a first hydrocarbyl residue, with a second monomer having formula I, wherein $R_3$ stands for a second hydrocarbyl residue, said first and second hydrocarbyl residues being different. This will allow for tailoring of the mechanical and electrical properties of the composition. The disclosed embodiment comprises the option of copolymerizing a first monomer having formula I, wherein $R_3$ stands for a linear hydrocarbyl residue, with a second monomer having formula I, wherein $R_3$ stands for a branched hydrocarbyl residue, the molar ratio of the first monomer to the second monomer is 95:5 to 5:95, in particular 90:10 to 10:90, preferably 80:20 to 20:80. Another alternative is to copolymerize a first monomer having formula I, wherein $R_3$ stands for methylene, with a second monomer having formula I, wherein $R_3$ stands for a hydrocarbyl residue having at least 2, preferably 2 to 6 carbon atoms. In that alternative, the molar ratio of the first monomer to the second monomer is 50:50 to 0.1:99.9, in particular 30:80 to 1:99, preferably 20:80 to 5:95. Preferably, the second monomer comprises a hydrocarbyl residue selected from ethylene, propylene, i-propylene, and n-, i- and t-butylene. The advantages of copolymerizing two different kinds of monomers of formula I will be discussed in more detail below.

As will appear from below, thin films having excellent properties can be obtained by polymerizing 1-(trimethoxysilyl)-2-(methyldichlorosilyl) ethane, 2,2,4,4,4-pentachloro-2,4-disilabutane, or 2,2,4,4,4-pentamethoxy-2,4-disilabutane.

Other interesting materials can be obtained by co-polymerizing 1-(trichlorosilyl)-2-(methyldichlorosilyl) ethane and 2,2,4,4,4-pentachloro-2,4-disilabutane, or 1-(trimethoxysilyl)-2-(methyldichlorosilyl) ethane and 2,2,4,4,4-pentamethoxy-2,4-disilabutane.

According to one preferred embodiment, in order to modify the properties, the siloxane material deposited on a substrate of a semiconductor device is heated to cause further cross-linking, whereby a film is obtained, having a shrinkage after heating of less than 10%, preferably less than 5%, in particular less than 2%, and a thermal stability of more 425° C.

The polymer of the present invention is capable of forming low dielectric films having a dielectric constant of 3.0 or less, in particular 2.9 or less, preferably about 2.5 to 1.9, a Young's modulus of at least 8.0, preferably 10.0 GPa or more, a porosity of 5% or less and cracking threshold of 2 um or more after subjected to thermal treatment. Also the film formed from the polymer using a multisilane component remains stable on a semiconductor structure at temperatures up to 500° C. or more after subjecting the film for thermal treatment at 450° C. or less for 1 hour or less.

As mentioned above, the present invention also provides methods of producing integrated circuit devices. Such methods typically comprise the steps of:

forming a plurality of transistors on a semiconductor substrate;

forming multilayer interconnects by:

depositing a layer of metal;

patterning the metal layer;

depositing a first dielectric material having a first modulus and a first k value;

depositing a second dielectric material having a second modulus higher than the first modulus of the first material and with a k value lower than the first k value of the first material; and patterning the first and second dielectric materials and depositing a via filling metal material into the patterned areas.

The material according to the invention used for the first dielectric layer is preferably an organosiloxane material, which has a repeating -M-O-M-O— backbone having a first organic substituent bound to the backbone, the material having a molecular weight of from 500 to 100,000 g/mol, where M is silicon and O is oxygen. The molecular weight is from 1500 to 30,000 g/mol, and it preferably exhibits one or several of the following properties:

a k value of 3.0 or less, a CTE of 25 ppm or less, and a density of 1.2 g/cm$^3$ or more.

The first dielectric material can be an organosiloxane material having a carbon to silicon ratio of 1.5 to 1 or more.

According to another embodiment, the invention provides a method for making an integrated circuit device, comprising the steps of forming transistors on a substrate;

depositing one of an electrically insulating or electrically conducting material;

patterning said one of an electrically insulating or electrically conducting material;

depositing the other of the electrically insulating or electrically conducting material, so as to form a layer over said transistors having both electrically insulating and electrically conducting portions;

wherein the electrically insulating material has a carbon to silicon ratio of 1.5 to 1 or more.

Due to the excellent properties of planarization, the patterning step can be carried out without a preceding step of chemical mechanical planarization. Alternatively, 45% or less of the total thickness of the second dielectric material is removed by performing chemical mechanical planarization on the second dielectric material.

The organosiloxane material can be deposited by polymerizing a monomer of formula I in a liquid medium formed by a first solvent to form a hydrolyzed product comprising a siloxane material; depositing the hydrolyzed product on the substrate as a thin layer; and curing the thin layer to form a thin film having a thickness of 0.01 to 10 um.

Whereas one of the dielectric materials comprises a material in accordance with the present invention, the other material can be a known, organic, inorganic, or organic/inorganic material, e.g. of the kind discussed above in the introductory portion of the description.

Generally, the organosiloxane material is a spin coated material.

The organosiloxane material is an organic-inorganic and has a coefficient of thermal expansion of 12 to 20 ppm. It can have a dielectric constant of 2.7 or less.

Further, the organosiloxane material has a dielectric constant of 3.0 or less. The deposited organosiloxane material has a glass transition temperature of 400° C. or more, preferably 450° C. or more, in particular 500° C. or more.

It is preferred that the organosiloxane layer has a dielectric constant of 2.5 or less. The modulus is 8.0 GPa or more, preferably 10.0 GPa or more. The density is 1.2 g/cm$^3$ or more, preferably 1.45 g/cm$^3$ or more, in particular 1.65 g/cm$^3$ or more.

In an integrated circuit device according to the invention, the electrically conductive regions typically comprise aluminum or copper.

Further details of the invention will be discussed in connection with the following working examples:

EXPERIMENTAL

Example 1

Vinyltrichlorosilane, in an amount of 142.2 g (0.880 mol), and 5 ml (5.55 g, 0.048 mol) methyldichlorosilane were introduced into a 500 ml vessel. The solution was heated up to 80° C. and 15 µl $H_2PtCl_6$/IPA catalyst solution was added. Exothermic reaction was observed immediately and heat was switched off. Rest of the methyldichlorosilane was added in ~20 ml portions during 30 min so that temperature of the solution did not raise over 130° C. The total amount of methyldichlorosilane was 104.2 g (0.906 mol, 2.9% excess). The solution was again heated up to 110° C. and stirred for an hour. The obtained solution was distilled. B.p. was 77° C./10 mbar and yield was 188 g (77%). The product, 1-(trichlorosilyl)-2-(methyldichlorosilyl) ethane, was analyzed with GC, $^{13}C$ and $^{29}Si$ NMR.

The synthesized molecule, 1-(trichlorosilyl)-2-(methyldichlorosilyl) ethane, (25.00 g, 0.090 mol) was weighed and dissolved to 100 ml methyl t-butyl ether (MTBE). The solution was transferred drop by drop into the solution containing 100 ml water and 100 ml MTBE. During addition, solution was mixed vigorously and solution temperature was –1 . . . –4° C. The addition time was 20 min. After addition, solution was mixed for 20 min at room temperature.

The MTBE phase was allowed to separate and was removed. The aqueous phase was extracted 2 times with 25 ml MTBE. The MTBE phase was extracted 4 times with 100 ml of water (pH 7) and then filtrated. The obtained solution was dried into dryness with rotary evaporator (40° C., <10 mbar) and finally with high vacuum (RT, 1 mbar, ½h). As a result, 12.6 g of low molecular weight material was obtained. The weight average molecular weight was 7,650 g/mol and the molecular weight distribution 1.28.

The material was dissolved in 50 g MTBE containing 0.146 g triethylamine. The solution was refluxed for 60 min and cooled to room temperature. Then, 20 g of a 2% HCl solution was added and stirred for 30 min. The MTBE phase was allowed to separate and was removed. The solution was extracted 3 times with 20 ml of water (pH 7). Subsequently, the solution was evaporating into dryness using a rotary evaporator (40° C., <10 mbar) and, finally, with high vacuum (RT, 1 mbar, 1 h). 10.9 g of polymer was obtained (theoretical yield 87%). The weight average molecular weight was 15,400 g/mol and the molecular weight distribution 1.78.

The invented polymer synthesis and polymerization method described herein is not limited to above mentioned solvents, catalysts and process conditions, but also similar solvents, catalyst and processing conditions are applicable. However, in course of this invention it is important to be able to synthesize and polymerize the final product with good yield from a single bridged multisilyl monomer without using any comonomers except for optionally isomeric monomers, which have an equal carbon number in the linking group even if not in the chain linking the silicon atoms together.

Comparative Example I

Trichlorosilyl methane (25.00 g, 0.167 mol) was weighed and dissolved in 100 ml methyl t-butyl ether (MTBE). The solution was transferred drop by drop into a solution formed by 150 ml water and 100 ml MTBE. During addition, the solution was vigorously mixed and the temperature of the solution was maintained at −1 . . . 0° C. Addition time was 10 min. After addition, the solution was mixed for 20 min at room temperature.

The MTBE phase was allowed to separate and was removed. Water phase was extracted 2 times with 50 ml MTBE. The MTBE phase was extracted 4 times with 100 ml of water (pH 7) and then filtrated. Solution was dried into dryness with rotary evaporator (40° C., <10 mbar) and finally with high vacuum (RT, 1 mbar, ½h). 11.3 g of low molecular weight material was obtained. Weight average molecular weight was 4400 g/mol and molecular weight distribution 1.08.

The material was dissolved in 44.7 g MTBE containing 0.045 g triethylamine. Solution was refluxed for 45 min and cooled to room temperature. 22.4 g 2% HCl solution was added and stirred for 30 min. MTBE phase was let to separate and was removed. Solution was extracted 3 times with 20 ml of water (pH 7). Solution was dried into dryness with rotary evaporator (40° C., <10 mbar) and finally with high vacuum (RT, 1 mbar, 1 h). 10.3 g of polymer was obtained (theoretical yield 92%). Weight average molecular weight was 6600 g/mol and molecular weight distribution 1.27.

Both example products (Example I and Comparative Example I) were then dissolved in propylene glycol monomethyl ether acetate (PGMEA) at various concentrations to obtain different nominal thicknesses once spin coated on silicon wafer. Still a typical dilution concentration is about 400 wt-% of PGMEA solvent against of the final polymer solid concentration. Furthermore, also other solvent can be used as a processing solvent or processing co-solvent such as mesitylene and GPL, but not limited to these. Typically, the materials are filtered after solvent concentration formulation with to remove particles out of the spin-on material. Also surfactants and wetting agents may be added prior spin-on processing. By varying the solid content and solvent viscosity (i.e., type of solvent) various thicknesses of above mentioned materials were able to obtain by processing the materials with spin-on deposition method, subjecting them to pre-bake cure and high temperature anneal step. For materials' film level characterization the film thickness always exceeded 600 nm when subjected to standard processing conditions, i.e., 2000 rpm spin speed, 150° C. pre-bake step for 5 minutes and high temperature cure at 450° C. for 1 hour. However, the invented material is not limited to these process conditions in the course of this invention.

Example 2

The present invention also encompasses isomers of 1-(trichlorosilyl)-2-(methyldichlorosilyl) ethane. Methyldichlorosilane (14.9 g, 0.130 mol), vinyl trichlorosilane (21.0 g, 0.130 mol) and 100 mg tetrakis(triphenylphosphine)palladium were placed in a glass pressure tube and heated to 105° C. After ~20 minutes, vigorous exothermic reaction too place and the solution turned dark. The content was distilled at 74° C./5 mbar to give 32.3 g (0.117 mol, 90%). Purity was >99% by GC. The resulting monomer was 1-(methyldichlorosilyl)-1-(trichlorosilyl) ethane.

Example 3

Alternative Method for Polymer

Examples 1 and 2 describe the synthesis of two monomers, i.e., 1-(trichlorosilyl)-2-(methyldichlorosilyl) ethane and 1-(methyldichlorosilyl)-1-(trichlorosilyl) ethane, which can be used as precursors of polymers.

These isomer compounds, one of which is comprising a linear linker chain and the other a branched linker chain, can be used in any ratio to form the novel dielectric siloxane polymers according to the present invention. Thus, the monomer comprising the linear linker molecule can be employed at a molar ratios of 1:100 to 100:1, preferably 80:20 to 20:80, in particular 60:40 to 40:60, with respect to the corresponding monomer comprising the branched linker molecule.

Example 4

Alternative Precursor and Polymer 2,2,4,4,4-pentamethoxy-2,4-disilabutane can be used as an alternative precursor in the course of this invention. It can be applied alone or together above mentioned 1-(trichlorosilyl)-2-(methyldichlorosilyl) ethane and 1-(methyldichlorosilyl)-1-(trichlorosilyl) ethane precursors. Even 2,2,4,4,4-pentamethoxy-2,4-disilabutane is not an isomer for precursors explained in Example 1 and 2, it can behaves in similar manner in polymerization and thus can co-polymerized with monomers explained in Examples 1 and 2 when in 2,2,4,4,4-pentachloro-2,4-disilabutane form. Further it can be homopolymerized or co-polymerized as an alkoxide derivative alone or together with alkoxy forms of precursors in Example 1 and Example 2. The synthesis routes for 2,2,4,4,4-pentachloro-2,4-disilabutane and 2,2,4,4,4-pentamethoxy-2,4-disilabutane are following.

55.10 g (0.337 mol) (ClCH$_2$)CH$_3$SiCl$_2$, 132.13 g (0.975 mol) HSiCl$_3$ and 7.45 g (0.025 mol) Bu$_4$PCl were added to a stainless steel pressure reactor. Reactor was heated up to 180° C. for 30 min. When pressure formation was not noticed anymore reactor was cooled down to room temperature. Solution was distilled yielding 58.85 g (66.5%) MeCl$_2$Si—CH$_2$—SiCl$_3$. B.p. 62° C./10 mbar. 58.85 g (0.224 mol) 2,2,4,4,4- pentachloro-2,4-disilabutane was added in small portions to a round bottom flask containing 120.0 g (1.131 mol) trimethyl orthoformate. 50 mg tetrabutylphosphoniun chloride was added as catalyst and solution was stirred at 70° C. After 48 hours reaction, no Si—Cl bonds remained as observed by shaking a small sample with distilled water, which remained neutral. Product was purified by distillation, b.p. 80/2 mbar.

In particular, the 2,2,4,4,4-pentachloro-2,4-disilabutane and 2,2,4,4,4-pentamethoxy-2,4-disilabutane can be applied to generate further rigidity for the dielectric matrix. Therefore, if additional mechanical rigidity, e.g., modulus and hardness, is required for the dielectric composition, it is then preferred to copolymerize 2,2,4,4,4-pentachloro-2,4-disilabutane or 2,2,4,4,4-pentamethoxy-2,4-disilabutane with other precursors according to formula I, such as with but not limited to 1-(trichlorosilyl)-2-(methyldichlorosilyl) ethane per Example I. The concentration of 2,2,4,4,4-pentachloro-2,4-disilabutane or 2,2,4,4,4-pentamethoxy-2,4-disilabutane can typically be 5-95 mol-%, but more preferably less 35 mol-%. Due to the similarity and number of reactive groups and the carbosilane nature of 2,2,4,4,4-pentachloro-2,4-disilabutane and 2,2,4,4,4-pentamethoxy-2,4-disilabutane they are well co-polymerizable together and very homogenous polymers are obtained.

Polymerization can of 1,1,1,3,3-Pentamethoxy-1,3-disilabutane can proceed, for example, in following manner. 1,1,1,3,3-Pentamethoxy-1,3-disilabutane by (20 g, 0.083 mol) and acetone (130 mL) were placed in a 250 mL rb flask. Then, 0.018M nitric acid (20 mL, 1.110 mol) was added, and the flask was stirred for one hour at rt, after which it was refluxed for 48 hours, followed by 72 hours again at rt. Distilled water was added (50 mL) and the solvents were evaporated under reduced pressure until solid content of the solution was 25%, giving polymer-water solution ~45 mL.

Material Characteristics

Material processed and formed on a substrate as above, was tested to determine various characteristics of the deposited and fully cured, i.e., cross-linked, material. Properties of the materials, such as cracking threshold, dielectric constant, Young's modulus and hardness, thermal stability, porosity and pore size were also measured.

The dielectric material of this invention can be deposited as very thin layers from 10 nm up to 10 um (or more). Generally, the material is deposited at a thickness of from 0.5 to 3 um, preferably from 1 to 5 um—though of course the thickness depends upon the actual use of the material. The thickness of the deposited layer can be controlled by controlling the material viscosity by molecular weight, solvent content and spinning speed (if deposited by spin on). The material thickness can also be controlled by adjusting the deposition temperature of both the deposition solution and the spinner (if spin on deposition). Also, adjusting the solvent vapor pressure and boiling point by selection of solvent can affect the thickness of the deposited material. Spin coating, spray coating, dip-coating, meniscus coating, screen printing and "doctor blade" methods can be used to achieve films of varying thickness. The cracking threshold was studied by spin depositing films with various thicknesses up to 3 um (measured after curing) and no cracks were observed in the polymer material of this invention after the cure (this case 1 hour at 450° C.).

Further properties of the densified materials include a density of at least 1.2 g/cm$^3$, preferably 1.45 g/cm$^3$ or more, 1.60 g/cm$^3$ or more, or even 1.75 g/cm$^3$ or more. The final material has a glass transition temperature, which is higher than 200° C., in particular 400° C. or more, in particular 500° C. or more. The glass transition temperature (and, naturally, the decomposition temperature) after full cure of the material should be higher than processing temperature of the semiconductor substrate thereafter. At the same time, the dielectric constant is favorably low—easily 3.0 or less, more typically 2.9 or less or even 2.5 or less. In addition, the organosiloxane material after being formed has a coefficient of thermal expansion of 12-22 ppm, generally 15-20 ppm.

The polymer organosiloxane material can be suitably deposited such as by spin-on, spray coating, dip coating, or the like. The CTE of the novel polymer as a thin film is less than 25* 10$^{-6}$ l/degC. The material can be characterized as being fully dense material which, in the present context means, in particular, that the porosity is low, typically less than 10%, preferably less than 5%, in particular less than 3% (by volume), and the average pore size is less than 3 nm, preferably less than 2 nm and in particular less than 1 nm. In course of this innovation, the porosity and pore size were tested with VASE (variable angle solvent ellipsometry) using toluene as a test solvent and PALS (positronium annihilation life-time spectroscopy).

In additional, the fully dense dielectric material can be subjected to annealing or a similar pretreatment or post-treatment of heated to the second temperature, i.e. the actual curing temperature. The pretreatment or post-treatment is carried out, e.g., by a process in which the material is subjected to UV radiation, DUV radiation, Extreme UV radiation, IR radiation, e-beam radiation, rapid thermal anneal, or a combination thereof. The treated films can be then subjected to curing at an elevated temperature in air, nitrogen, argon, forming gas or vacuum. However, in the course of this invention the polymer explained in the example I does not require any additional treatment to result in properties summarized in Table I, but these additional treatments can be rather considered to enhance further polymer's film level properties.

The annealed and cured (densified, crosslinked) material can be subjected to deposition of a second layer selected from a metal, a barrier, a liner or an additional dielectric layer.

Mechanical properties, Young's modulus and hardness, were tested in terms of nanoindentation (with MTS nanointender) always from films thicker than 600 nm in thickness. The Young's modulus of the invented bridged polyorganosiloxane type material is 8.0 GPa or more, preferably 10.0 GPa or more. The film hardness of the invented polyorganosiloxane material is 1.0 GPa or more, more preferably 1.5 GPa or more.

The material was also tested for gap filling in terms of coating the polymer explained in Example I on top of narrow high aspect ratio features on a semiconductor substrate and subjecting the polymer on pre-bake and high temperature treatments, 150° C. for 5 minutes and 450° C. for 60 minutes, respectively. The narrow gap structures down to 35 nm with aspect ratio of up to 10:1 or more were applied in these experiments and a complete gap fill was observed. Also, no density differences were obtained between at top and bottom parts of the gap. In similar manner, local and global planarization was tested on isolated and dense semiconductor structures. The local planarization was observed to be 95% or better and the global planarization was 70% or better.

The shrinkage of the material, in particular after heating to promote cross-linking, is less than 5%, in particular less than 2%.

The electrical properties were tested from MIS (metal insulator semiconductor) structure using HP LCR meter and semiconductor analyzer with a semiconductor electrical test probe station.

Figure 1:
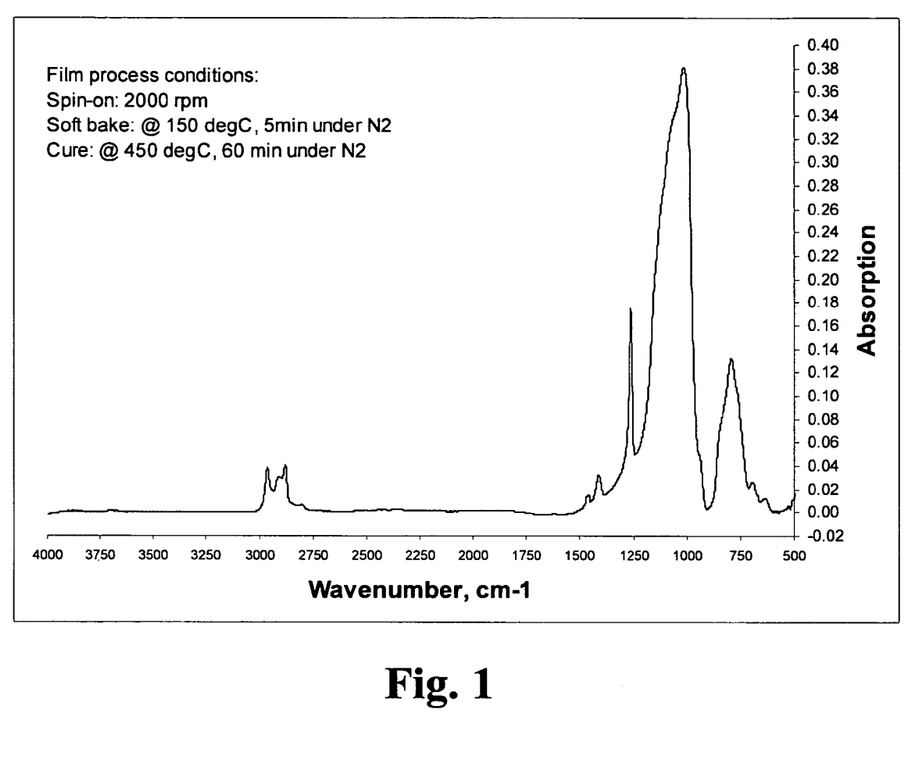
FIG. 1 shows the FT-IR spectrum of the polymer prepared in Example 1.

The polymer described in Example I according to this invention also is free of water and silanol after the high temperature cure that was verified in terms of film level FT-IR spectroscopy. As presented in FIG. 1, the FT-IR spectrum does not contain absorption peaks around 3200 cm$^{-1}$ to 3800 cm$^{-1}$ wherein water and silanol absorption peaks could be observed, thus evidencing that the film is silanol free.

Properties of the material of the present invention (Example I) and conventional material of Comparative Example I are presented in Table 1.

TABLE 1

|  | EXAMPLE I | COMPARATIVE EXAMPLE I |
|---|---|---|
| Young's modulus | 10.5 GPa | 4.8 GPa |
| Hardness | 1.5 Gpa | 0.6 GPa |
| Dielectric constant (k) | 2.87 | 2.80 |
| Porosity | 1.5% ± 1.5% | 10% ± 2% |
| Pore size (diameter) | 0.9 nm | 1.5 nm |
| Cracking threshold | 3000 nm | 1000 nm |

It should be pointed out that if precursors according invention as per Formula I are copolymerized with a precursor or similar alkoxy derivative according Comparative Example I, then the material properties similar Example I in Table 1 would not be achievable, but rather be significantly inferior. Therefore, it preferable to copolymerize precursors according to Fomula I and as explained in Examples 1 through 4.

High Temperaure Processing

Because the material of the present invention is stable at very high temperatures, they are particularly suitable for high temperature processing. In general, the materials can be exposed to temperatures of 450° C. or more, or 500° C. or more without degradation. Thus, after deposition and curing, one or more following process steps can be at a temperature of 450° C. or more (or even 500° C. or more). As one example, in place of a tungsten via, a hot aluminum (also known as "aluminum reflow process") via fill could be performed following deposition of the siloxane material of the invention. Again as an example, in general, the materials needs to remain unchanged at these following process steps that may take place even at 500° C. or more for relatively short period of time, even if the material actual curing prior these following process steps is 450° C. or less.

Figure 2A:
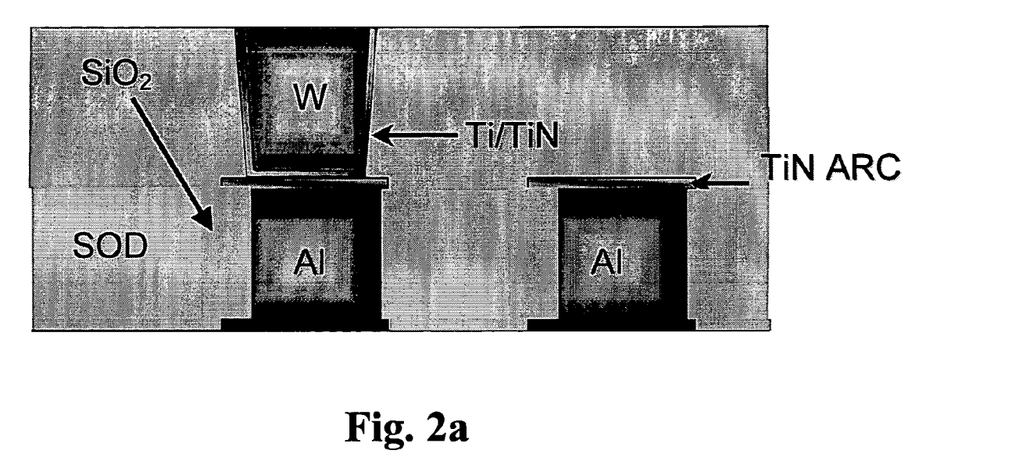
FIG. 2a shows in cross-section a tungsten via processed in accordance with the present invention.

In a tungsten via process in accordance with the present invention, as can be seen in FIG. 2a, after depositing a layer of aluminum, the aluminum is patterned to form "gaps" within the aluminum layer. Into these gaps is deposited silicon dioxide (by CVD), followed by deposition of the siloxane (SO) material to fill the gaps. Additional silicon dioxide is deposited on the siloxane material, followed by chemical mechanical planariztion (CMP). Vias are formed in this layer of silicon dioxide by photolithography and etching down to a TiN$_x$ stop on the aluminum layer. After ashing, wet cleaning and degassing, a barrier layer of Ti/TiN$_x$ is deposited (this could also be SiOx) within the via "gaps", followed by deposition of tungsten (CVD of tungsten from WF$_6$ precursor at 300° C.). Finally the tungsten layer is chemically mechanically planarized, before proceeding to the next metal layer.

Figure 2B:
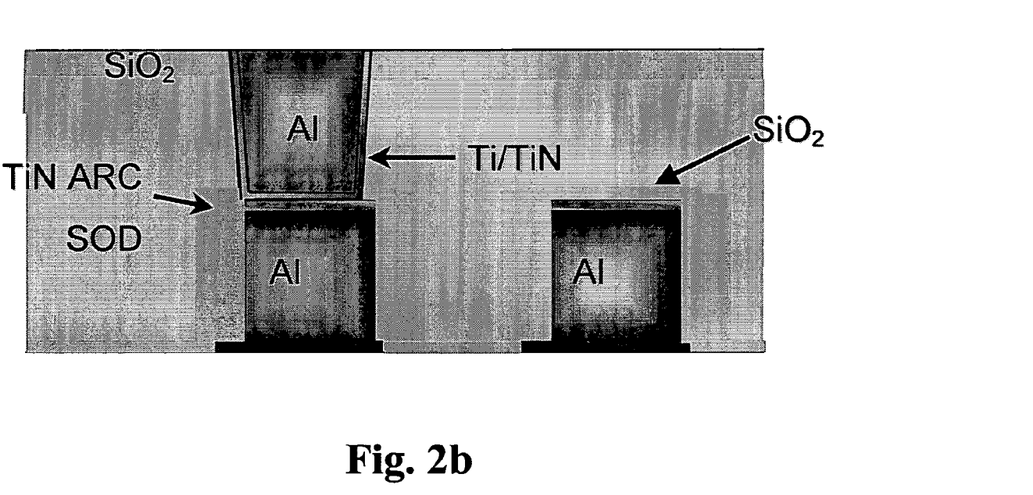
FIG. 2b shows in cross-section a via formed by a hot aluminum process.

Though this is one suitable method for the materials disclosed herein, due to the lower cost of aluminum as compared to tungsten, and the lower need for a CMP step, it is sometimes preferred to form the tungsten vias from aluminum—though achieving uniform filling within the vias with aluminum requires a "hot aluminum" step—generally deposition of aluminum at 450° C. or more, or even 500° C. or more if desired. In such a hot aluminum process, as can be seen in FIG. 2b, first is deposited and patterned the lower aluminum and TiN$_x$ (ARC) layers to form "gaps". Into these gaps is deposited first a barrier SiO$_x$ layer, followed by the siloxane material of the invention. The spin-on dielectric siloxane material of the present invention (SOD) is deposited not only in the patterned gaps in the aluminum layer (e.g. around 500 nm thick Al layer), but also above the aluminum layer (e.g. 300 nm higher). On top of the SOD material (this could also be deposited by CVD) is deposited a layer of SiO$_x$ by CVD (more particularly, this can be TEOS—tetra ethyl ortho silicate/silicon tetra ethoxide). Without performing a chemical mechanical planarizing step (or by removing through planarization 45% or less of the thickness of this SiO$_x$/TEOS layer—or generally 35% or even 25% or less), via lithography is performed to form vias down to the aluminum layer. After ashing, wet cleaning and degassing, a barrier layer is deposited (e.g. Ti/TiN$_x$), followed by deposition of the hot aluminum at a temperature of 450° C. or more, often 500° C. or more. The aluminum is chemically mechanically planarized prior to proceeding to the next metal layer. Desirably, the siloxane material of the present invention has no detectable change in k value or modulus (or no substantial change that affects the ability of the siloxane material to be used in such processes), nor does the siloxane material outgas, even if exposed to temperatures of 450° C. or more, or 500° C. or more (or even 525° C. or more depending upon the length of time of such exposure).

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

Due to the thermal stability and excellent gap fill of the invented material, it can be also utilized as dielectric material in PMD (pre-metal dielectric) and STI (Shallow Trench Isolation) applications. Dielectrics for these applications are typically deposited with HD-CVD (high density chemical vapor deposition) process. However, HDP-CVD cannot make good and uniform gap fill for very narrow and high aspect ratio structures that specially needed in PMD and STI applications. Therefore, the invented material as explained earlier has competitive advantages in performance and cost over traditional processes.

The invention claimed is:

1. A thin film comprising a composition obtained by polymerizing a first monomer having the formula I:

wherein:
R$_1$ is a hydrolysable group,
R$_2$ is a polarizability reducing organic group, and
R$_3$ is a bridging linear hydrocarbyl residue,
with a second monomer having the formula I, wherein R$_1$ and R$_2$ are as defined above and R$_3$ is a bridging branched hydrocarbyl residue, the molar ratio of the first monomer to the second monomer being 95:5 to 5:95,
to form a siloxane material.

2. The thin film according to claim 1, wherein R$_1$ is selected from the group of halides, alkoxy groups and acyloxy groups, $R_2$ is selected from alkyl groups, alkenyl groups and aryl groups, and $R_3$ is selected from linear and branched alkylene groups, alkenylene groups and alkynylene groups.

3. The thin film according to claim 1, wherein the composition is a cross-linked poly(organosiloxane).

4. The thin film according to claim 1, comprising a cured thin layer of the poly(organosiloxane) having a thickness of 0.01 to 50 μm.

5. The thin film according to claim 1, having a density of at least 1.2 g/cm$^3$.

6. The thin film according to claim 1, having either or both of the following properties:
 a glass transition temperature, which is higher than 200° C., in particular 400° C. or more, in particular 500° C. or more, and
 a dielectric constant of 3.5 or less, in particular 2.9 or less, preferably about 2.5 to 1.9.

7. The thin film according to claim 1, having a coefficient of thermal expansion of 12-22.

8. The thin film according to claim 1, comprising an organosiloxane material having a (weight average) molecular weight of from 500 to 100,000 g/mol.

9. An object comprising a low k dielectric film, the film comprising a material according to claim 1.

10. The thin film according to claim 1, wherein the molar ratio of the first monomer to the second monomer is 90:10 to 10:90.

11. The thin film according to claim 1, wherein the molar ratio of the first monomer to the second monomer is 80:20 to 20:80.

12. The thin film according to claim 1, comprising a cured thin layer of the poly(organosiloxane) having a thickness of 0.5 to 5 μm.

13. The thin film according to claim 1, comprising a cured thin layer of the poly(organosiloxane) having a thickness of 1 to 3 μm.

14. The thin film according to claim 1, having a density of at least 1.45 g/cm$^3$ or more.

15. The thin film according to claim 1, having a density of at least 1.60 g/cm$^3$ or more.

16. The thin film according to claim 1, having a density of at least 1.60 g/cm$^3$ and up to about 2.5 g/cm$^3$.

17. The thin film according to claim 1, having a coefficient of thermal expansion of 15-20 ppm.

* * * * *